(12) United States Patent
Pathak et al.

(10) Patent No.: US 6,411,549 B1
(45) Date of Patent: Jun. 25, 2002

(54) REFERENCE CELL FOR HIGH SPEED SENSING IN NON-VOLATILE MEMORIES

(75) Inventors: Saroj Pathak, Los Altos Hills; James E. Payne, Boulder Creek; Jagdish Pathak, Los Altos Hills, all of CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/602,108

(22) Filed: Jun. 21, 2000

(51) Int. Cl.$^7$ .............................................. G11C 16/06
(52) U.S. Cl. ............................ 365/185.2; 365/185.21; 365/210
(58) Field of Search ...................... 365/185.2, 185.21, 365/210, 185.05, 189.07, 189.09, 230.04; 327/51

(56) References Cited

U.S. PATENT DOCUMENTS

| | | | |
|---|---|---|---|
| 5,157,626 A | * 10/1992 | Watanabe | 365/185 |
| 5,572,474 A | 11/1996 | Sheen et al. | 365/207 |
| 5,608,676 A | 3/1997 | Medlock et al. | 365/189.09 |
| 5,642,308 A | 6/1997 | Yoshida | 365/185.12 |
| 5,659,503 A | * 8/1997 | Sudo et al. | 365/185.2 |
| 5,757,697 A | * 5/1998 | Briner | 365/185.21 |
| 5,790,453 A | 8/1998 | Chevallier | 365/185.03 |
| 5,859,796 A | * 1/1999 | Cleveland | 365/185.2 |
| 5,936,888 A | * 8/1999 | Sugawara | 365/185.2 |
| 6,118,701 A | * 9/2000 | Uekubo | 365/185.2 |

* cited by examiner

*Primary Examiner*—David Nelms
*Assistant Examiner*—Gene N. Auduong
(74) *Attorney, Agent, or Firm*—Thomas Schneck; John P. McGuire, Jr.

(57) ABSTRACT

A reference cell for use in a high speed sensing circuit includes a first sub-circuit and a second sub-circuit. The first sub-circuit has a structure similar to memory cells within odd number rows of a main memory array. The second sub-circuit has a structure similar to memory cells within even numbered rows of the main memory array. If a target cell within the main memory array lies within an odd numbered row, then the first sub-circuit is selected, and if the target cell lies within an even numbered row, then second sub-circuit is selected. Both of the first and second sub-circuits include a reference transistors having its control gate broken into two parts. A first part is a poly 1 layer and is separated from the channel region by a tunneling oxide. A second part is a metal or poly 2 layer over the first part and separated from the first part by a gate oxide. A via is used to connect the first part to the second part.

53 Claims, 7 Drawing Sheets

REFERENCE CELL FOR HIGH SPEED SENSING IN NON-VOLATILE MEMORIES

FIELD OF THE INVENTION

The present invention relates to sense amplifiers for use with nonvolatile semiconductor memories. More specifically, it relates to the structure of a reference memory cell used in establishing a reference voltage for a sense amplifier.

BACKGROUND ART

Within a memory IC, sense amplifiers are used to read data from a target memory cell within a memory array. These amplifiers are typically categorized as single-ended sense amplifiers or differential sense amplifier. Single-ended sense amplifiers are commonly used in memories having a single-bit per memory cell. Examples of single-bit per cell memories are EEPROM and Flash EPROMs. These single-bit per cell memories store only one of the true value or compliment value of a datum item in each memory cell. This is in contrast to dual-bit per cell memories such as SRAMs, which store both the true and complement value of a datum item in each memory cell. Having both the true and complement value of a datum item within each memory cell facilitates and speeds up the reading of a memory cell since one can identify the stored datum item by simultaneously accessing both true and complement bits and simply determining which has the higher voltage potential. Stated more clearly, SRAMs use differential amplifiers to read each memory cell, and identify the logic state stored within a memory cell as soon as the direction of the voltage imbalance, representative of the true and complimentary data stored within the memory cell, is determined. Since single-bit per cell memories do not have the luxury of knowing the compliment of the stored datum item, their single-ended sensing circuitry requires a different, and more critically balanced approach.

Use of a differential sense amplifier in a nonvolatile memory would provide a big boost in reading speed, but would require two memory storage devices per memory cell, one for the true data and another for the complement data. This would reduce the memory capacity at least by 50%. It is more likely that the reduction would be much greater because of the need to accommodate additional bitlines, equalization circuitry, more complex program and erase circuitry, and other circuitry required to implement a dual-bit per memory cell architecture. Therefore, nonvolatile memories generally use single-ended sense amplifiers.

With reference to FIG. 1, a single-ended sensing circuit 12 suitable for use with a single-bit memory cell is shown 14. Target single-bit memory cell 14 is depicted as a single floating gate transistor 16. Sensing circuit 12 determines the logic state stored within target memory cell 14 by sensing a potential difference between a sense line 18 coupled to target memory cell 14 and a reference line 20 coupled to a reference memory cell 22. The potential of sense line 18 is dependent on the logic state, high or low, of the datum stored within target memory cell 14. Typically, if the potential of sense line 18 is higher than that of reference line 20, then target memory cell 14 is read as having a logic low state, and if the potential of sense line 18 is lower than reference line 20, then target memory cell 14 is read as having a logic high state. Therefore, it is important that the voltage potential of reference line 20 be maintained at a value intermediate the logic high and logic low voltage potentials of target cell 14.

At first glance, it would appear that the reference voltage on line 20 could be produced with a constant voltage generator, but this is not preferred. The potential at sense line 18 is affected not only by the potential at the gate of floating gate transistor 16, but also by the architecture of the memory. The capacitive loads of target memory cell 14 depend on its physical structure and on its location within a larger memory array. These capacitive loads, in turn, affect the current sourcing capability of target memory cell 14 and thereby the potential at sense line 18.

Therefore, an effort is made to help reference line 20 reflect these capacitive loads in order to better track the logic high and logic low voltages of target memory cell 16. A typical method of tracking these effects on the logic high and logic low voltages of a target memory cell is to use another memory cell, i.e. a reference memory cell 22, to produce the voltage potential for reference line 20. The idea is that since the reference memory cell 22 hag a similar structure as target memory cell 14, its behavior will be similar to that of target cell 14. The potential of reference line 20 is therefore dependent on the current sourcing value of reference cell 22.

Various methods of using a reference cell for producing the reference voltage for use with a single-ended sensing circuit are known in the art. Some of these methods are discussed in U.S. Pat. No. 5,572,474 to Sheen et al., U.S. Pat. No. 5,608,679 to Medlock et al., and U.S. Pat. No. 5,642,308 to Yoshida.

Applicants have found, however, that existing methods of generating a reference voltage on reference line 20 are not stable over the life of the memory IC. This is in part due to reference cell 22 using a floating gate transistor 26 to produce the reference voltage. Although using a floating gate transistor 26 within reference cell 22 is advantageous because it provides a better balance with the floating gate transistor 16 of target memory cell 14, floating gate transistor 26 introduces additional problems that may complicate generating an accurate reference voltage on reference line 20.

Since the threshold voltage of reference cell 22 should not changed, reference cell 22 is isolated from program and erase circuitry used in altering the state of the storage memory cells 14 in a main memory array. Reference memory cells, in general, are constructed with no charge on their floating gate 28, and the charge level on their floating gate 28 is not intended to change since they are not connected to any programming or erasing circuitry. If desired, the threshold voltage level of reference cells may be adjusted by adjusting the substrate doping concentration of their channel region.

Unfortunately, there are several factors that can alter the charge level of a reference cell's floating gate 28. Floating gate transistors, in general, are susceptible to read disturb problems that can change the amount of charge on a reference cell's floating gate 28, which results in a change in its threshold voltage. This can result in a change in the cell's reference current value, which in turn changes the voltage value of reference line 20. Due to the critical balancing of the sensing circuit 12, a voltage change in sense line 20 can, at best, slow down sensing circuit 12, and at worst, cause it to read erroneous data.

Additionally, Applicants have identified another source of error associated with the use of a floating gate reference cell 22. The manufacturing of nonvolatile memory ICs often requires the use of plasmas. Plasma has an intrinsic electric charge associate with it that will typically alter the charge on the floating gate of a nonvolatile memory cell during the manufacturing process. To accommodate for this change in the floating gate charge, the main memory array is typically subjected to an erase sequence at the end of the manufacturing process. However, since reference cell 22 is isolated from the main memory's program and erase circuitry, it is not erased in this erase sequence and its floating gate is not brought to a neutral position. One method of addressing this problem is to subject the entire memory IC to ultra violet, UV, light for a predetermined period of time at the end of the manufacturing process. Exposure to UV light can erase reference cell 22, but one cannot be certain that reference cell 22 is fully erased. As a result, sense amplifier 12 must accommodate for such variations, which necessarily slows it down.

As the density of nonvolatile memories continues to increase and their speeds requirements continue to rise, every factor affecting the speed performance becomes more critical. It is an object of the present invention to provide a faster, and more process insensitive, sense amplifier.

It is another object of the present invention to generate a reference voltage for use with a sense amplifier that is not affected by threshold voltage changes in the sense amplifier's reference cell, but which still accurately tracks variations in a target memory cell within the main memory array.

It is still another object to provide a reference cell that compensate for layout variations in a compact EEPROM memory structure.

SUMMARY OF THE INVENTION

The above objects are met in a single-ended sense amplifier having a reference cell circuit whose structure mirrors that of the main memory array, but which does not rely on accurate measures of charge stored within a floating gate to establish a reference voltage. The sense amplifier's reference voltage is dependent on the level of current sourced by its reference cell. This level of current is in turn dependent on the reference cell's threshold voltage, structural characteristics and physical layout. Since the structure of the reference cell is similar to that of the target memory array, the reference voltage tracks changes over the life of the target memory array. To better track the physical layout of a target memory cell within the main memory array, the present reference cell circuit include two different reference cell layouts. A first reference cell layout corresponds to the layout of a target memory cell in an even numbered row, and a second reference cell layout correspond to the layout of a target memory cell in an odd numbered row. This permits even closer tracking of cell layout variations of target cell within the main memory array.

A reference cell's threshold voltage, and thereby its current sourcing capability, is also dependent on the amount of charge on its floating gate. As explained above, the charge on the floating gate establishes a threshold voltage for a memory cell, which determines how much current it sources in response to a voltage applied at its control gate. Applicants have found, however, that reliance on the floating gate to establish the threshold voltage of the reference cell can introduce unexpected errors.

During the manufacture of a memory IC, it is often required that the memory IC be submitted to a plasma process step. This, for example, may be part of a plasma etchant step. Plasma has an associated charge, and the floating gates of all floating gate transistors will be partly charged during a plasma step. This does not severely affect the main array since it generally undergoes an erase sequence during initial testing of the memory IC, which removes any accumulated charge from their respective floating gates. The reference cells, however, do not under this erase step. Indeed, memory IC's typically do not have erase circuitry coupled to the reference cells. To reduce the charge trapped within the floating gates after manufacture, the memory IC is typically subjected to an ultra violet erase step. Ideally, the UV light should remove the charge within each memory cell and bring all floating gate within an IC to a known charge state. This is critical for the reference cell since it must generate a known, and precisely controlled current. Any variation from the expected value will slow down the sensing of a cell since the tolerance margins would have to be relaxed. It has been found, however, that not all referenced cells are fully erased during this UV light erase step, which prevents the IC from having its read margins tightened and thereby its read access time shorten.

Even if the charge in a the reference cell can be initiated to known low values, the charge on the floating gate is prone to vary over the life of the memory. In other words, the charge on the reference cell will change over time as a result of normal read operations. This is due to various phenomena, such as an error known as read disturb, which can cause a small change in the amount of charge stored within a floating gate by virtue of repeated read operations. Since the reference cell is read every time any memory cell within the main memory array is read, the reference cell is more susceptible to read disturb problems.

The present invention addresses both of the above listed, floating gate related, sources of error by not allowing the reference cell's floating gate to float. The reference cell's control gate is connected to the cell's floating gate. This permits the present invention to eliminates any errors resulting from charge variations on a floating gate. Furthermore, this also allows a better control of the exact voltage coupling of the floating gate to the control gate. Floating gate cells typically having an 85% to 90% coupling ratio between their control gate and their floating gate, and this coupling ratio cannot be controlled to an exact value. Additionally, the effective coupling margin is likely to change over the life the cell as the charge on the floating gate varies. By offering a precise coupling ratio of 100%, the present invention can further tighten the operating margins of the memory IC and thereby increase its speed.

Since the amount of charge on the floating gate is controlled by a direct line from its control gate, it is not susceptible to charge buildup or charge leakage on the floating gate. Thus, the present reference cell is unaffected by charge buildup caused by plasma steps in the manufacturing process. This also makes the reference memory cell resistant to other floating gate related errors such as read disturb and aging. The amount of charge on the floating gate is directly adjusted by a digitally controlled, constant reference voltage source coupled to the control gate of the reference cell's control gate. This permits the present invention to tighten the operating margins even more, resulting in greater speed gains.

Use of a reference cell having its control gate tied to its floating gate allows the present invention to focus on tracking the architectural layout of the target memory cells within the main memory array. The reference cell of the present invention tracks a target memory cell's structure, ion implantation profile, layout, etc. to assure an accurate comparison for read operations, without being prone to the errors associated with the use of a floating gate structure.

Preferably, the reference cell circuitry of the present sense amplifier consists of two reference cells to mimic two floating gate transistors on adjacent rows of a target memory array sharing the same bitline and the same source line. It has been found that the memory array layout can affect the reading of a targeted memory cell. A first target memory cell lying within a first row may produce a different voltage on its bitline, than a second target memory cell having the same stored data value and coupled to the same bit line but lying on an adjacent row. This is in part due to the physical layout orientation of the two cell which causes them "to see" different capacitive load levels. To compensate for this, the layout of the two reference floating gate transistors of the present invention is constructed in a manner corresponding to the memory layout of a target memory cell on an even number row coupled to an adjacent target memory cell in an odd number row. The digitally controlled constant reference voltage source of the present invention can determine whether an even number row or an odd number row is being addressed, and activate only the reference floating gate transistor having a layout corresponding to the appropriately targeted even or odd numbered row. This permits the present invention to better match voltage variations within the main memory array and thereby further tighten operating margins to achieve higher speeds.

BEST MODE FOR CARRYING OUT THE INVENTION

Figure 1:
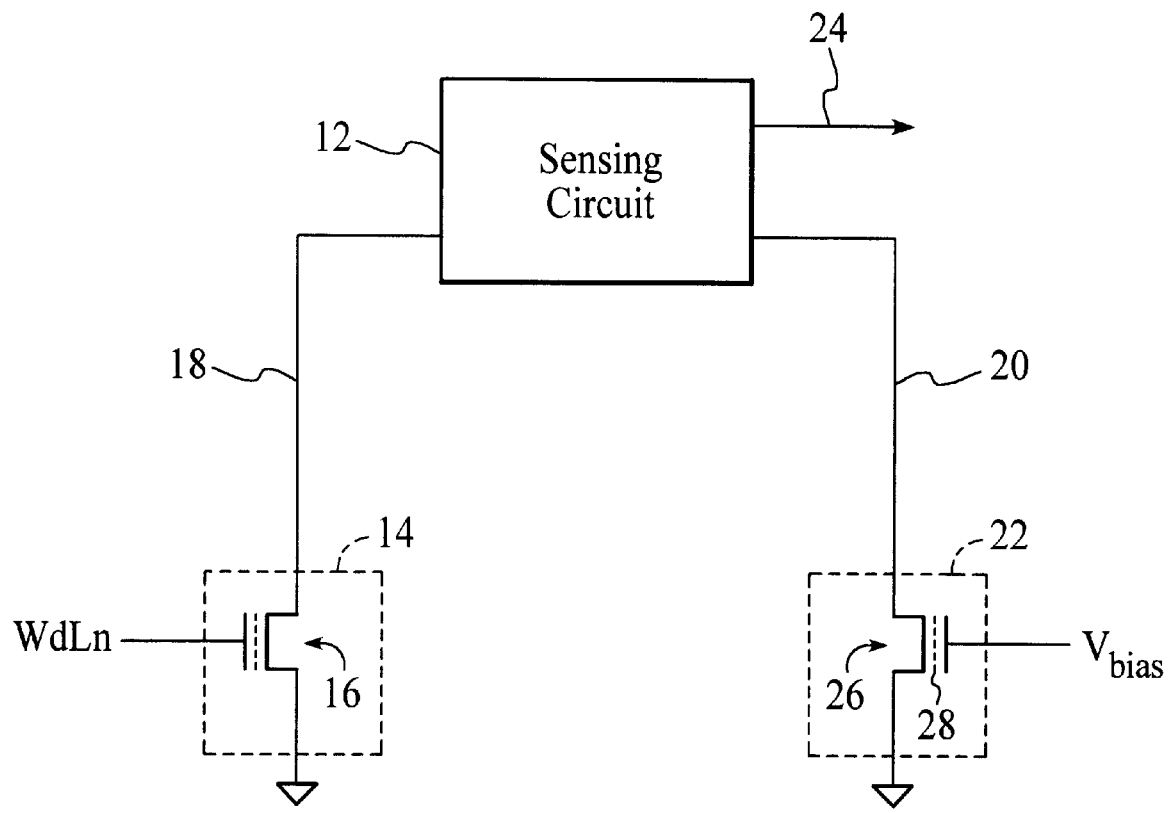
FIG. 1 is prior art view of a single-ended sense amplifier and a reference cell.
Figure 2:
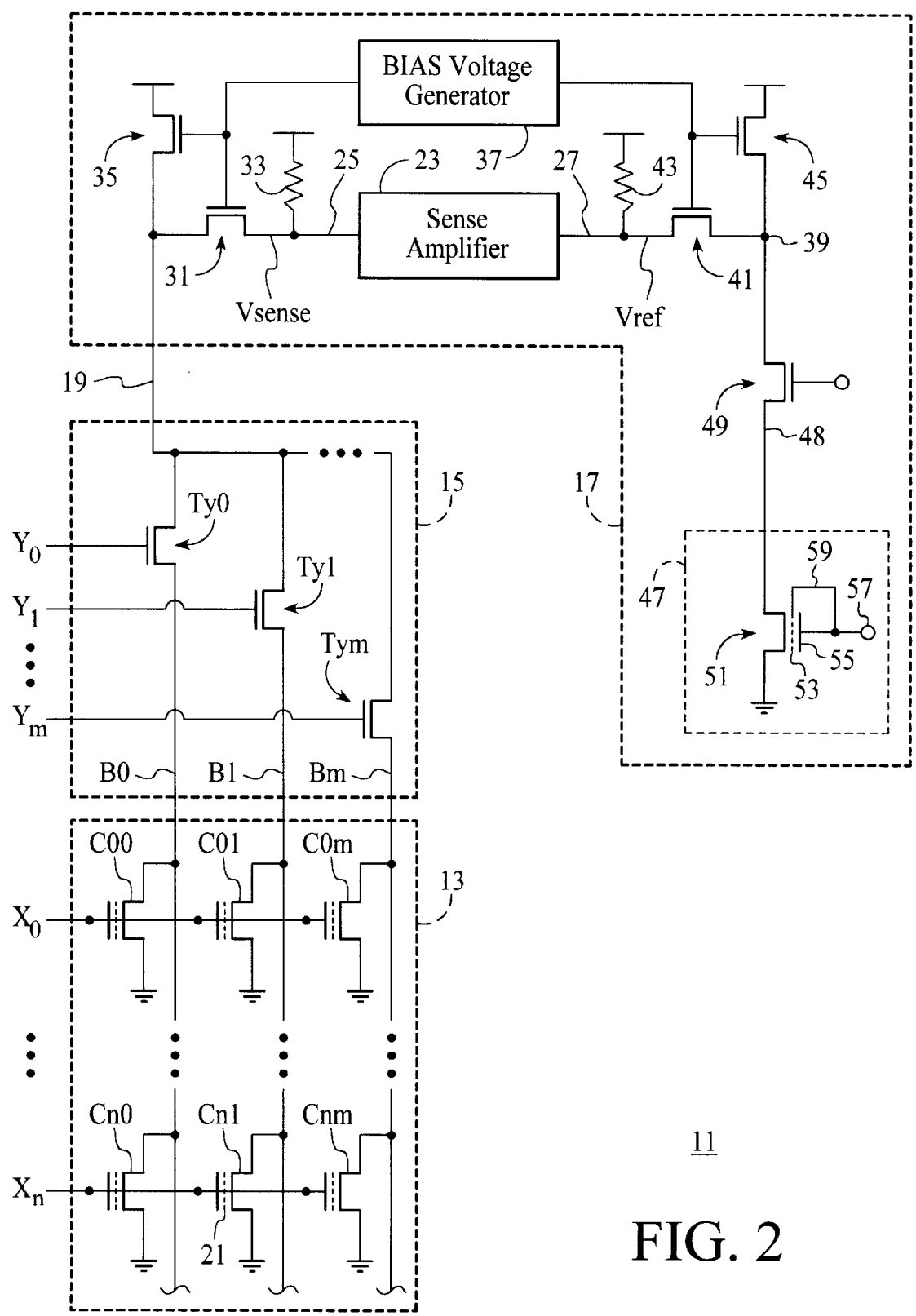
FIG. 2 is a flash memory structure using a sensing scheme in accord with a first embodiment of the present invention.

With reference to FIG. 2, a sample view of a partial flash memory 11 in accord with the present invention is shown. The sample view shows a main memory array 13 coupled through a partial y-decoder 15 to a single-ended sensing circuit 17. Memory array 13 consists of a plurality of memory cells C00 to Cnm arranged in n rows and m columns. An X-address permits each row of memory cells to be individually addressed by selecting, i.e. actuating, a corresponding wordline, X0 to Xn. Similarly, each column of memory cells may be uniquely identified by a Y-address that selects a corresponding bitline B0 to Bm. An individual memory cell is selected if it lies at the intersection of a selected wordline and a selected bitline. For example, if it were desired to select memory cell Cnl for a read operation, then wordline Xn, corresponding to row n, and bitline B1, corresponding to column 1, would be selected.

To select row n, a read voltage, of for example 5V, is applied to wordline Xn while all other wordlines received 0V. The read voltage applied to wordline Xn is applied to all memory cells within the row defined by wordline Xn, i.e. memory cells Cn0 to Cnm. Anyone of memory cells Cn0 to Cnm within the selected row may respond to the applied read voltage by coupling its drain to ground, which would consequently couple its corresponding bitline B0 to Bm to ground. As a result, multiple bitlines B0 to Bm may be coupled to ground during a read operation.

Single-ended sensing circuit 17 determines the logic level of the data stored within a selected memory cell by determining if the target cell's corresponding bitline is coupled to ground during the read operation. Typically, a bitline coupled to ground is indicative of a logic 1 and a bitline isolated from ground is indicative of a logic 0. Therefore, in order to read memory cell Cn1, flash memory 11 must determine if Cn1's corresponding bitline, B1, is coupled to ground. In order to do this, it must ignore the state of all other bitlines. Partial y-decoder 15 isolates the bitline corresponding to target memory cell Cn1, bitline B1 in this case, from all other bitlines and couples it to an intermediate noae 19, which is an input to single-ended sensing circuit 17. Y-select lines Y0 to Ym activate one of Y-decode transistor Ty0 to Tym. By actuating only Y-select line Y1, only the corresponding bitline, i.e. B1, is coupled to intermediate node 19.

A memory cell, C00 to Cnm, couples its corresponding bitline, B0 to Bm, to ground if its threshold voltage is below the read voltage applied to its corresponding wordline X0 to Xn. Otherwise, the memory cell C00 to Cnm remains off and its corresponding bitllne remains isolated from ground. Thus, logic high and low data is stored in a memory cell by adjusting the memory cell's threshold voltage. This is done by adding or removing charge from the floating gate of the non-volatile floating gate transistor within the memory cell. To store a logic high, i.e. logic 1, charge is removed from floating gate 21, which lowers its threshold voltage below the read voltage. Conversely, to store a logic low, i.e. logic 0, charge is added to floating gate 21, which raises it threshold voltage above the read voltage.

Single-ended sensing circuit 17 includes a differential amplifier, typically referred to in the art as a sense amplifier 23 having two inputs, a sense line 25 and a reference line 27. Since sense line 25 is coupled to a pull-up device represented as pull-up resistor 33. Sense line 25 is also coupled to intermediate node 19 through a pass NMOS device 31. Intermediate node 19 is additional coupled to VCC via a pull-up NMOS device 35. If intermediate node 19 is not coupled to any bitline, B0 to Bm, then it will be pulled up toward a predetermined reference high voltage through pull-up NMOS device 35 and pull-up resistor 33.

A bias voltage generator 37 determines the actual reference high voltage of intermediate node 19. The source electrode of an NMOS transistor cannot rise higher than one threshold voltage below the potential applied to its control gate. Since the output of bias voltage generator 37 is coupled to the control gate of both NMOS device 31 and 35 and their respective source electrodes are coupled to intermediate node 19, the highest potential intermediate node 19 can reach is at most one threshold voltage below the output of bias voltage generator 37.

Whenever partial y-decoder 15 couples a bitline, B0 to Bm, to intermediate node 19, the higher capacitive value of the bitline causes the voltage at intermediate node 19 to be momentarily pulled down. Pull-up NMOS device 35 and pull-up resistor 33 then start raising the voltage of intermediate node 19. The final voltage value of intermediate node 19 depends on the datum stored within the target memory cell. If the target memory cell has a logic 0, and thus remains off in response to an applied read voltage, then the corresponding bitline will be isolated from ground and intermediate node 19 will rise to the aforementioned predetermined voltage. On the other hand, if the targeted memory cell has a logic 1, and thus turns on in response to an applied read voltage, then the corresponding bitline will be coupled to ground through the memory transistor and the potential of intermediate node 19 will reach a lower potential. since sense line 25 is coupled to intermediate node 19 through NMOS device 31, its potential Vsense tracks that of intermediate node 19.

Figure 3:
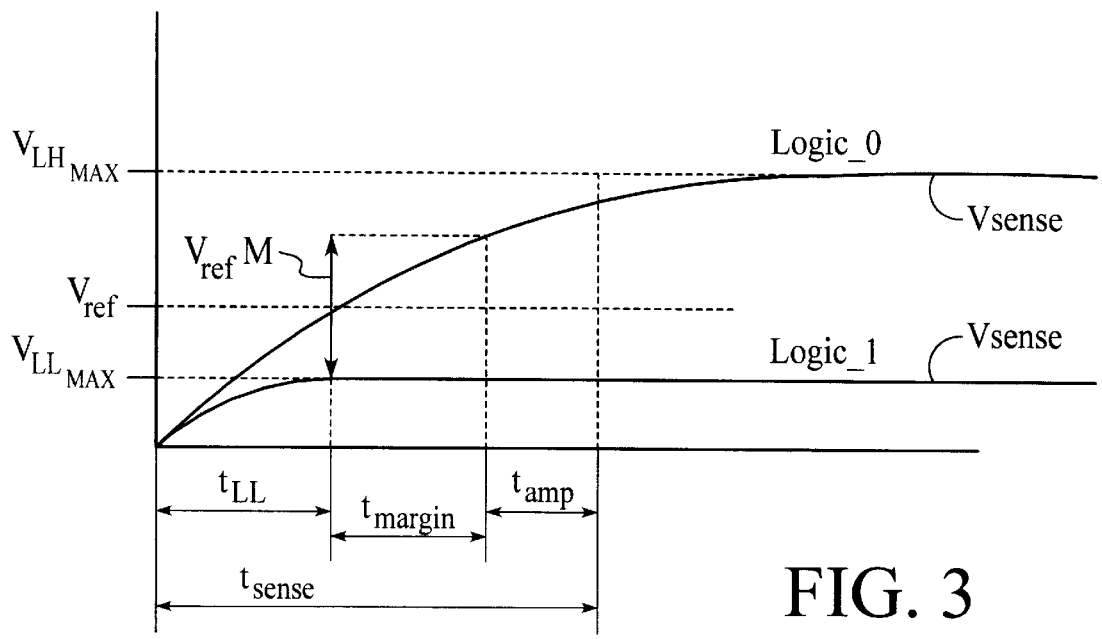
FIG. 3 is a plot of voltage potentials on a sense line and on a reference line.

With reference to FIG. 3, sample Vsense voltages corresponding to the reading of a logic 0 and a logic 1 are shown. Initially, Vsense is pulled low when intermediate node 19 is first coupled to a selected bitline. If the targeted memory transistor has a logic 1, then Vsense will rise to a maximum logic low potential, $VLL_{MAX}$, but remain below reference voltage Vref. If the targeted memory transistor has a logic 0, then Vsense will rise to a maximum logic high voltage $VLH_{MAX}$ that is above reference voltage Vref. In this manner, sense amplifier 23 can determine the contents of a targeted memory transistor.

It should be noted that Vref is defined by a maximum error margin $V_{ref}M$. As explained above, reference voltage Vref applied to sense amplifier 23 is prone to vary for a variety of reasons. Therefore, the value of Vref may not be assumed to be absolute and must instead be defined by a margin of error $V_{ref}M$. As a result, sense amplifier 23 may not identify a logic 0 signal until Vsense has been given enough time to rise above Vref's margin of error. The time required for sense amplifier 23 to determine the logic state of the targeted memory transistor is labeled $t_{sense}$ in FIG. 3.

As seen, $t_{sense}$ is the sum of three components, $t_{LL}$, $t_{margin}$, and $t_{AMP}$. The $t_{LL}$ time is the maximum time required for a logic low signal to reach its highest potential $VLL_{MAX}$. After this, sense amplifier 23 must wait for the time, $t_{margin}$, that it would take a logic high signal to rise above Vref's error margin, VrefM. Finally, $t_{AMP}$, is the time required for sense amplifier 23 to make a decision about the voltage value of Vsense relative Vref. Times $t_{LL}$ and $t_{AMP}$ are fixed, but time $t_{margin}$ may be reduced by reducing Vref's margin of error, $V_{ref}M$.

Figure 4:
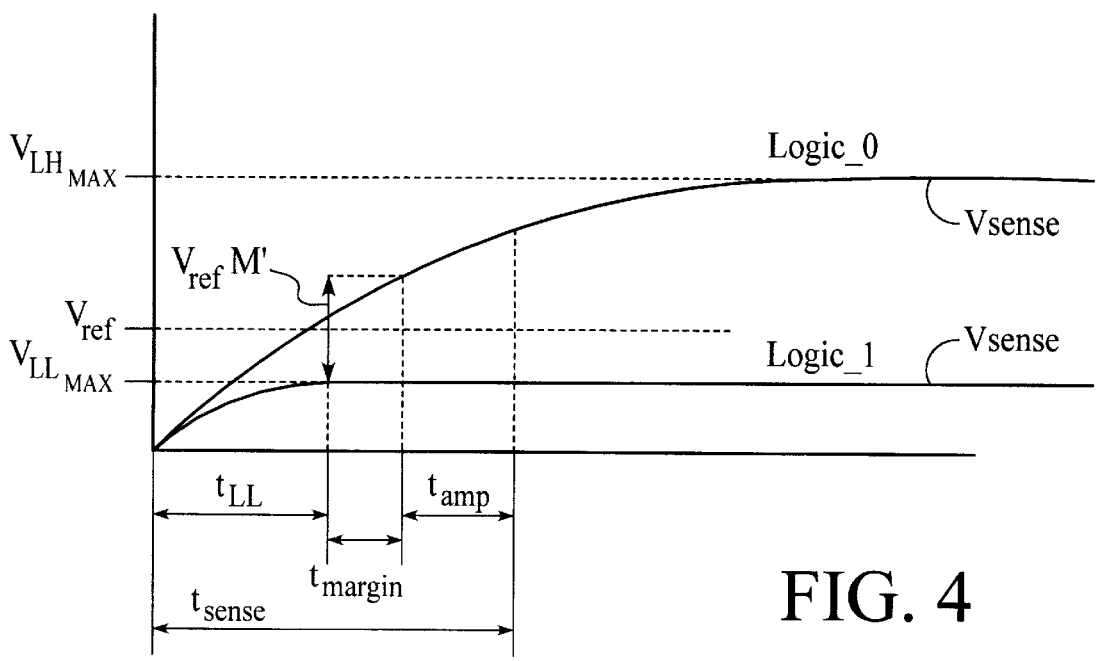
FIG. 4 is plot of voltage potentials on a sense line and reference line having tighter tolerance levels that shown in FIG. 3.

With reference to FIG. 4, an example of a shorter sense time $t_{sense}$ resulting from a reduced margin of error $V_{ref}M$ is shown. All elements in FIG. 4 similar to those of FIG. 3 are identified with similar reference characters and are explained above. In the present example, the error margin $V_{ref}M$ of reference voltage Vref is reduced by about 15% to form new $V_{ref}M'$ in FIG. 4. Because of the logarithmic nature of the rise time of Vsense, this 15% reduction in the error margin of reference voltage Vref, results in almost a 70% reduction in the $t_{margin}$, the time that the sense amplifier must wait for a logic high Vsense signal to rise from $VLL_{MAX}$ to above the error margin $V_{ref}M'$. In the present example, the 15% reduction in VrefM also resulted in a 20% reduction in the overall tsense time required for sene amplifier 23 to compare Vsense to Vref. Thus, even small improvements in Vref's error margin can result in sizable gains in speed.

Returning to FIG. 2, Vref is the potential of reference line 27. As explained above, it is important that Vref track variations in main memory array 13. Therefore, most of the circuit elements in the read path of memory array 13 are reproduced in the path for generating the reference voltage.

Reference line 27 is shown coupled to a second pull-up resistor 43 and coupled to a second intermediate node 39 via a second NMOS pass transistor 41. Second intermediate node 39 is coupled to Vcc via a second pull-up NMOS device 45. A reference memory cell 47 is coupled through a select transistor 49 to second intermediate node 39. This structure mirrors the structure used to address main memory array 13 through y-decoder 15. The main difference in that the structure of reference memory cell 47 is not the same as that of any of memory cells C00 to Cnm in main memory array 13.

Reference cell 47 does not include a memory transistor. Rather, it includes a reference transistor 51 having a structure similar to the memory transistors within memory cells C00 to Cnm in main memory array 13, but reference transistor 51 does not have a floating gate. The control gate of reference transistor 51 is broken into two parts, a first part 55 is in direct contact with a control line 57 and a second part 53 is interpose between the first part 55 and the channel of reference transistor 51. This second part 53 of the control gate is separated from the first part 55 and from the transistor channel by insulative oxide. The dimensions of the first part 55 are preferably the same as the dimensions of the control gates of memory cells C00 to Cnm, and the dimensions of the second part 53 are is preferably the same as the floating gates 21 of memory cells C00 to Cnm. Also, the oxide separating the second part 53 from the first part 55 is preferably the same as the inter-gate oxide separating the floating gate 21 from the control gate within memory cells C00 to Cnm. Lastly, the dimensions of the oxide separating the second part 53 of the control gate from the channel region of reference transistor 51 is preferably the same as the tunneling oxide separating the floating gate 21 of memory cells C00 to Cnm from their respective channel regions. Structurally, reference transistor 51 looks like a floating gate transistor within any of memory cells C00 to Cnm and has similar dimensions, but reference transistor 51 additionally has a coupling arm 59 connecting the first part 53 of its control gate to the second part 55 of its control gate.

In this manner, the second part 53 of the control gate, which would represent a floating gate in memory cells C00 to Cnm is not allowed to float. Therefore, reference cell 47 is not susceptible to voltage threshold variations resulting from the alteration of charge on the second part 53 of its control gate. This is because charge cannot be stored on interpose part 53 of the reference transistor's control gate and therefore its threshold voltage cannot be altered in this manner. As a direct result, the present invention is not susceptible to reference voltage Vref variations resulting from the use of plasma during its manufacturing process. Again, this is due to the potential of the second, interpose part 53 being directly controlled by the first part 55 of the control gate. Additionally, the present invention overcomes the problem of not having absolute control over the coupling ration between the control gate and floating gate of a prior art reference cell, as described above. In the present case, the second interpose part 53 has a 100% coupling ration to the first part 55 of the control gate through connecting arm 59. With these sources of error eliminated, the margin of error of Vref can be reduced resulting in faster reading speeds.

Figure 5:
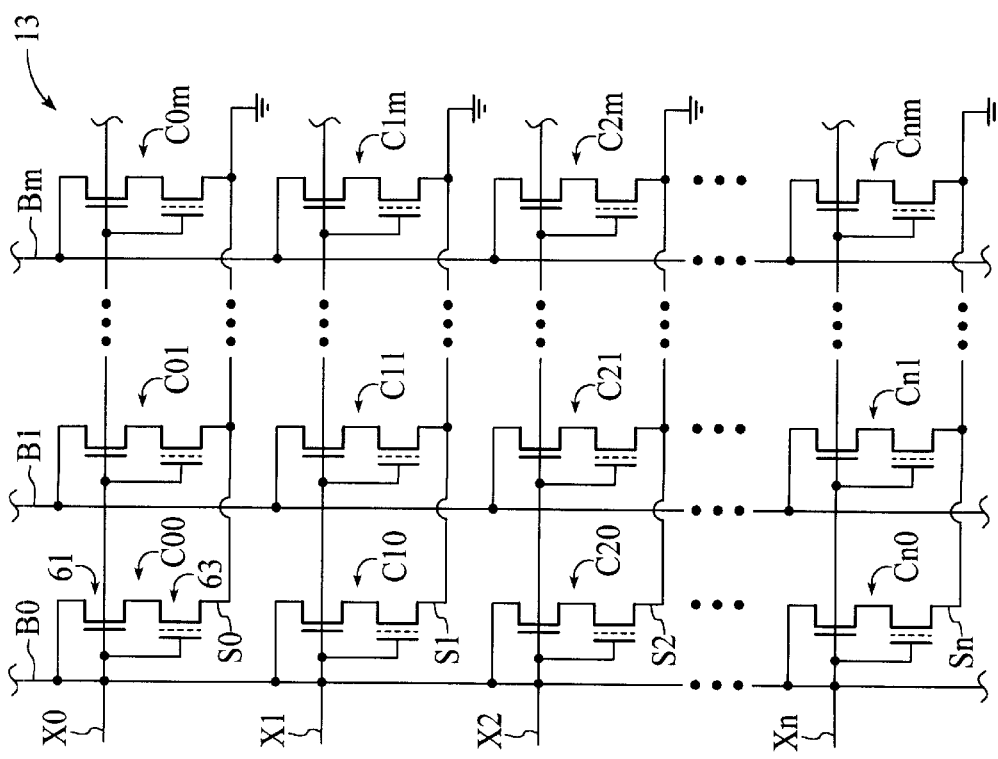
FIG. 5 is a first sample layout of an EEPROM main memory array in accord with the present invention.

In FIG. 2, main memory array 13 is shown having a structure typical in EPROM and Flash EPROM memories, but the structure of memory array 13 could be replaced with that of an EEPROM. FIG. 5, for example, shows a memory array 13 having an EEPROM memory array arrangement. As it would be understood, the memory array 13 of FIG. 5 would typically take the place of memory array 13 of FIG.

2. Therefore, all elements in memory array 13 of FIG. 5 similar to those of memory array 13 of FIG. 2 are given similar reference characters and are explained above. In the present case, each cell C00 to Cnm consists of a select transistor 61 in series with a floating gate memory transistor 63. Each wordline X0 to Xn is coupled to the control gate of both the select 61 transistor and floating gate transistor 63 of each memory cell C00 to Cnm within a corresponding row. Each row has a separate ground source line S0 to Sn, and source electrode of all floating gate transistors 63 within each row are coupled to their corresponding source line.

A reference cell in accord with the present invention would match the architecture of any of memory cells C00 to Cnm within memory array 13 of FIG. 5 with the exception that the floating gate would be shorted to the control gate. In effect, reference cell 47 of FIG. 2 would be replaced with a two transistor reference cell. The two transistor reference cell would follow the structure of reference cells C00 to Cnm in FIG. 5 and have a select transistor in series with a two-gate transistor similar to that the select transistor 61 in series with floating gate transistor 63 of main memory array 13. The main difference would be that in the reference cell, the floating gate would have a coupling arm connecting it to its respective control gate, in a manner similar to reference transistor 51 of FIG. 2. Although the architecture of FIG. 5 is easily integrated into the architecture of FIG. 2, it is not the most convenient since it requires much more space in an IC.

Figure 6:
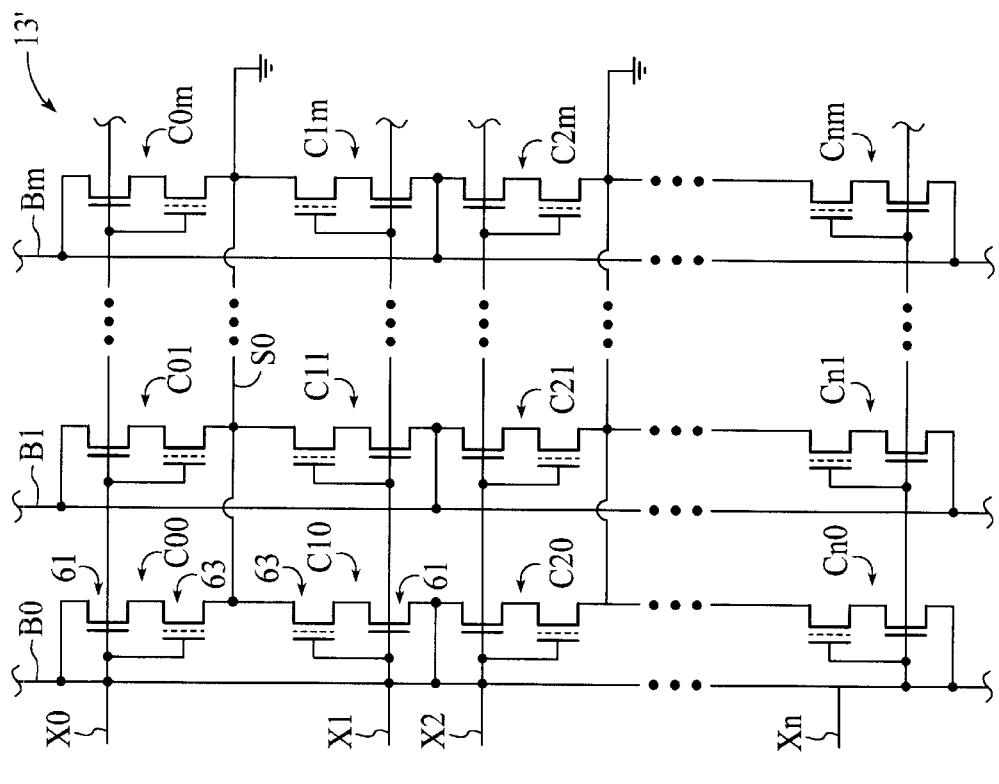
FIG. 6 is a second sample layout of an EEPROM main memory array in accord with the present invention.

A more compact memory array architecture suitable for an EEPROM memory is shown in FIG. 6. All elements in FIG. 6 similar to those of FIG. 5 are given similar reference characters and are explained above. The structure of FIG. 6 requires only one source line S0 per pair of wordlines X0, X1 Additionally, memory cells in adjacent rows share drain connections to a common bitline. This reduces the number of required contacts per memory cell and thereby reduces the size of the overall memory array 13.

This compact structure, however, complicates the use of the reference memory cell used within the sensing circuit 17. As explained above, it is desirable that the reference cell match the general structure of the memory cells within the main memory array 13. Although the reference cell would still require a select transistor in series with a floating gate memory transistor, as was required with the structure of FIG. 5, Applicants have found that such a structure does not provide the best component matching and does not provide for the most reduction of the error margin of reference voltage Vref.

The layout of a memory array can greatly affect its capacitance distribution, and thus its behavior. Simply using a two-transistor memory cell within the reference cell in a memory using the array structure 13 of FIG. 6 would not assure that the reference voltage Vref would accurately track changes in the main array 13.

Figure 7:
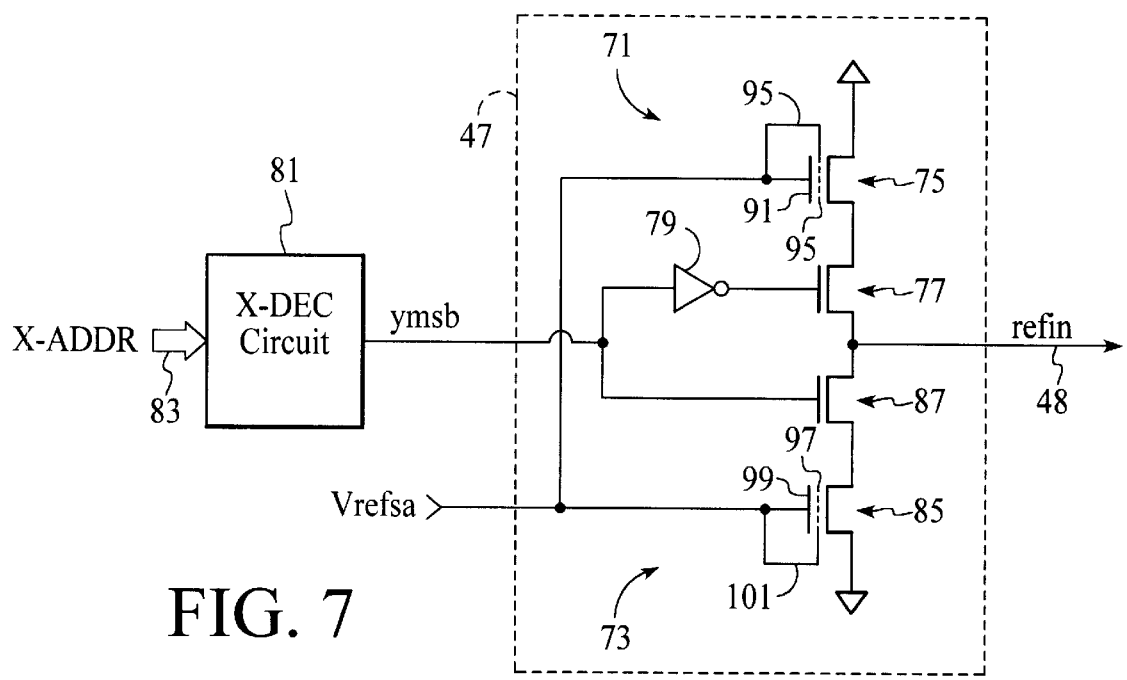
FIG. 7 is a reference cell in accord with a second embodiment of the present invention.

With reference to FIG. 7, a reference cell 47 in accord with a second embodiment of the present invention and suitable for the memory array layout of FIG. 6 is shown. Reference cell 47 includes first and second sub-components 73 and 71, only one of which is active during each read operation. First sub-component 73 consists of a first select device 87, implemented as an nmos switch transistor, in series with a first reference transistor 85. First select device 87 and first reference transistor 85 are connected in series between an output lead, refin, 48 and ground. Second sub-component 71 consists of a second select device 77, implemented as an nmos switch transistor, in series with a second reference transistor 75. Second select device 77 and second reference transistor 85 are connected in series between output lead 48 and ground.

A control line ymsb selectively activates one of first and second sub-components 71 and 73. Control signal ymsb is coupled through an inverter 79 to the control gate of second select device 77, and ymsb is coupled directly to the control gate of first select device 87. If control signal ymsb has a logic high, then first sub-circuit 73 is activated, and if control signal ymsb has a logic low, then second select sub-circuit 71 is selected. The logic state of control signal ymsb is directly related to the whether an even or odd numbered row is selected within main memory array 13.

An X-decoding circuit 81 receives X-address bus 83, which carries the address of the row being addressed within main memory 13. X-decoder circuit 81 may be the main X-address decoder that is used to select a row Of memory cells within main memory array 13, or it may be a second X-address decoder especially used for selecting one of first and second sub-circuits 71 and 73. Alternatively, signal ymsb may be tapped off of the least significant bit of the x-address since a zero on this bit would be indicative of an even numbered row and a 1 would be indicative of an odd numbered row. In this case, the x-address itself would control the reference cell 47.

If X-decoder 81 is part of the main X-address decoder, then X-decoding circuitry 81 includes an X-predecoder in series with an X-decoder, and together they select a single wordline within main memory array 13. In this case, X-decoding circuit 81 also issues a signal on control line ymsb. In this presently preferred embodiment, if X-address bus 83 indicates an even numbered row, then a logic low will be placed on control line ymsb and second sub-circuit 71 will be selected. Conversely, if X-address bus 83 indicates an odd numbered row, then a logic high will be placed on control line ymsb and first sub-circuit 73 will be selected. Since X-decoding circuit 81 will typically know if an odd or even numbered row is being address after its X-predecoder state and before its X-decoder, signal ymsb may be issued before the exact address of the selected wordline has been fully decoded. This permits the appropriate sub-component within reference cell 47 to already be selected prior to initiating reading of a target memory cell.

In this manner, the present reference cell 47 can more accurately track changes in the layout of a targeted memory cell within the main memory array. As stated above, the read potential of a two-transistor memory cell arranged in a compact architecture, like in FIG. 6, will likely vary depending on whether an even numbered or odd numbered row is selected. In order to more closely follow this variation in the read potential, and thereby reduced the error margin of reference voltage Vref, first sub-component 73 matches the layout of a target memory cell within an odd numbered row and second sub-component 71 matches the layout of a targeted memory cell within an even numbered row. Additionally, the control gate and floating gate of reference transistors 75 and 85 are shorted together by respective coupling arms 95 and 101 in a manner similar to that shown in FIG. 2. The exact value applied to control gates 91 and 99 of reference transistors 75 and 85, respectively, is applied by control line Vrefsa.

Figure 8:
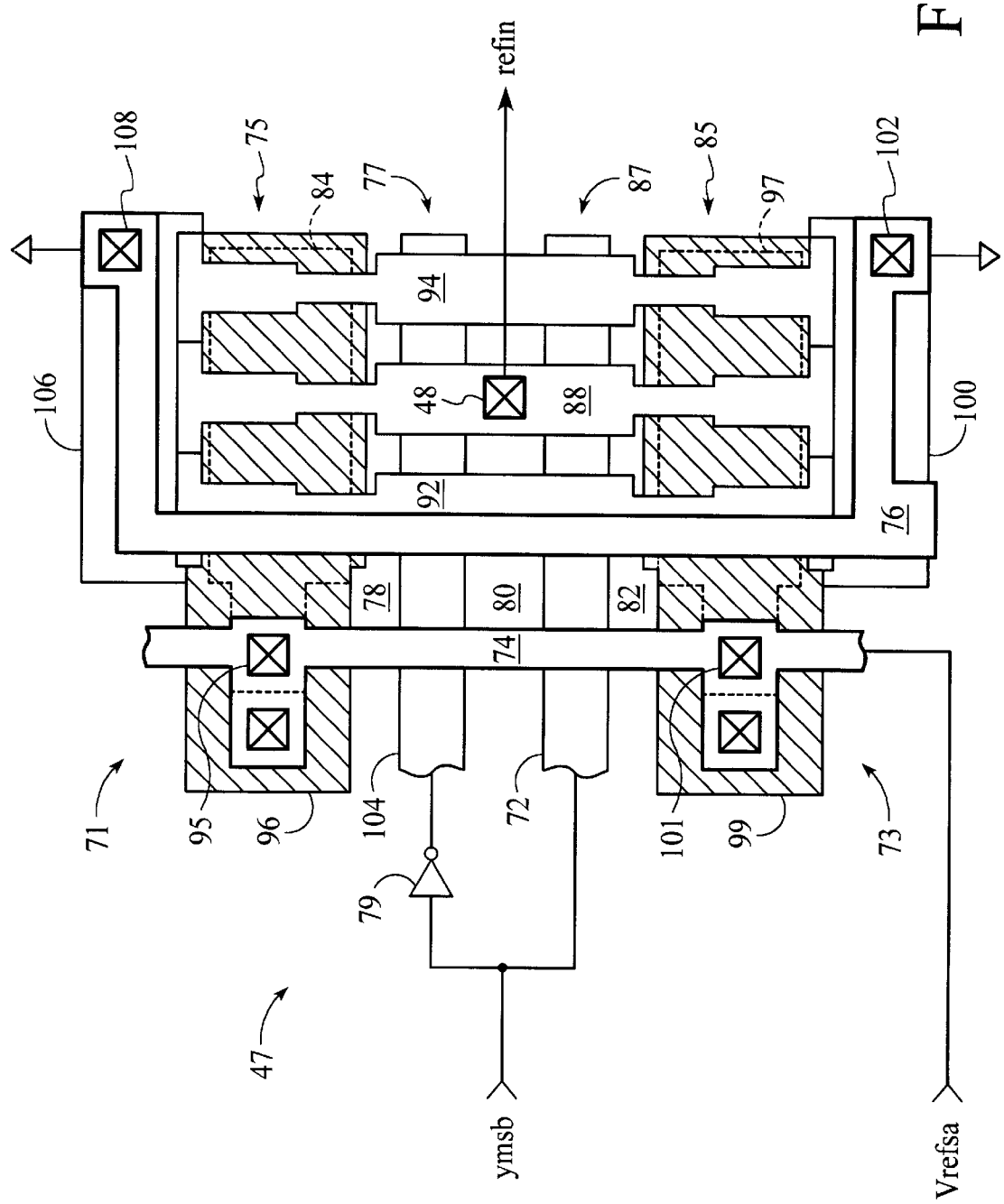
FIG. 8 is a control voltage generator for a reference in accord with the present invention.

With reference to FIG. 8, a layout representation of the reference cell of FIG. 7 is shown. As before, reference cell 47 is responsive to a control line ymsb, which is coupled to inverter 79 and to the control gate 72 of first select device 87. The output of inverter 79 is connected to the control gate 104 of second select device 77. Control line ymsb selects which of first 73 and second 71 sub-components is activated during each read operation. First sub-component 73 includes first select device 87 and first reference transistor 85. First select device 87 is defined by a drain region 80 and source region 82 separated by a polysilicon control gate 72 over a channel region. The source region 82 of first select device 87 functions as the drain of first reference transistor 85. The source 100 of first reference transistor 85 is coupled to ground and to a routing metal line 76 by means of a via 102. The channel region between drain 82 and source 100 is overlaid by a first polysilicon layer, poly-1, forming gate 97 under a second polysilicon layer, poly-2, forming gate 99. As explained before, poly-1 gate 97 and poly-2 gate 99 are coupled together by mean of a coupling arm 101. In the present example, coupling arm 101 are implemented as a via coupling first poly layer 97 to second poly layer 99.

Similarly, the second sub-component 71 includes second select device 77 and second reference transistor 75. Second select device 77 is defined by a drain region 80 and source region 78 separated by a polysilicon control gate 104 over a channel region. Thus region 80 forms the drain region of both first and second select devices 77 and 87. The source region 78 of second select device 77 functions as the drain of second reference transistor 75. The source 106 of second reference transistor 75 is coupled to ground and to routing metal line 76 by means of a second via 108. Thus, the source regions of both first and second reference devices 75 and 85 are coupled together by means of metal routing line 76. The channel region between drain 78 and source 106 is overlaid by a poly-1 gate 95 under a poly-2 gate 91. As explained before, poly-1 gate 95 and poly-2 gate 91 are coupled together by mean of a coupling arm 95 implemented as a via. Coupling arms 95 and 101 are connected together by means of metal routing line 74, and they are also coupled to the reference voltage line Vrefsa. Output reference line refin is taken at via 48, which couples not only a partial bitline 88, but also drain region 80. Two additional partial bitlines 92 and 94 are laid adjacent partial bitline 88. This helps simulate the capacitance associated with having multiple target memory cells adjacent each other within a main memory array.

Figure 9:
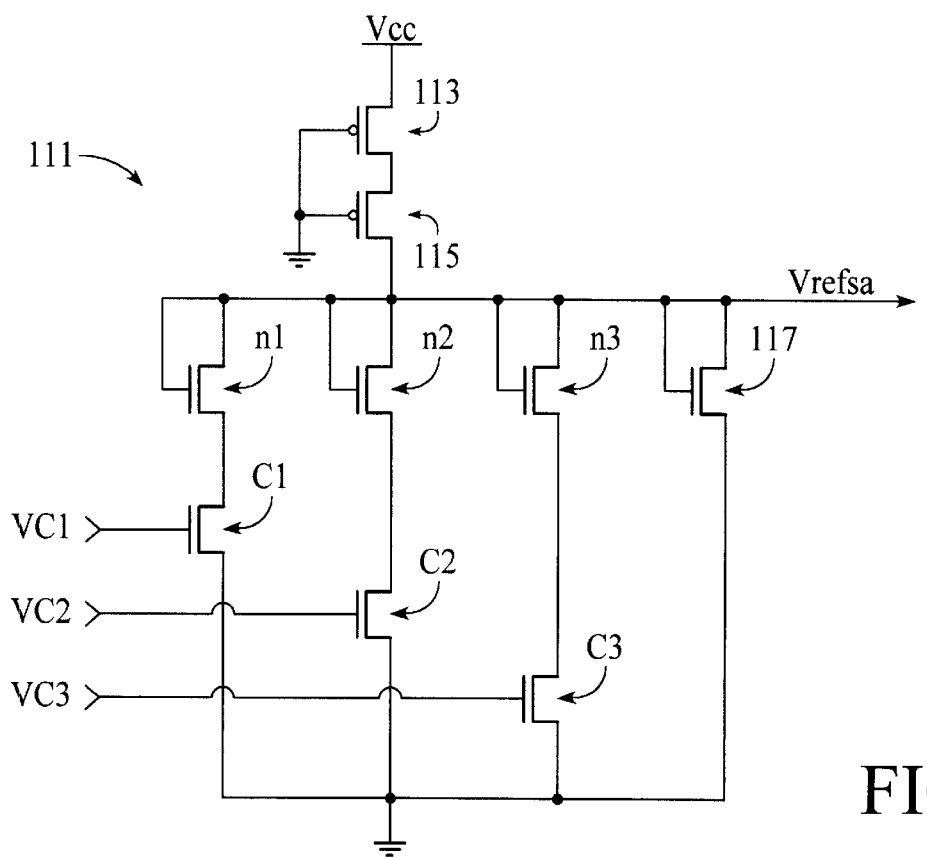
FIG. 9 is a layout view of a reference cell in accord with the second embodiment of the present invention.

With reference to FIG. 9 the voltage value of control line Vrefsa is controlled by a reference voltage generating circuit 111, which consists of a pull-up branch and a pull-down branch in series between Vcc and ground. The pull-up branch includes two pmos transistors 113 and 115, and the pull-down branch includes at least one nmos transistor 117. The control gates of pmos transistors 113 and 115 are connected to ground, and the control gate of nmos transistor 117 is connected to its drain in a diode formation. This generates a current through transistors 113, 115, and 117 from Vcc to ground. The value of Vrefsa is dependent on the voltage drop across the pull-down branch, which in turn is dependent on the current through transistors 113, 115, and 117. If desired, nmos transistor 117 may be the combination of multiple predefined nmos transistors and multiple optional nmos transistors connectable at the manufacturing stage with metal options. This permits the current through the pull-down branch, and thereby the voltage on Vrefsa, to be hardwired to a specific value during production.

In the present embodiment, the pull-down branch includes additional, optional nmos transistor that may be digitally inserted or removed from the composite pull-down branch. Each of nmos transistors n1 to n3 is diode connected and is selectively coupled to ground by a respective control switch transistor C1 to C3. Each of control switch transistors C1 to C3 is responsive to a voltage control line VC1 to VC3. By appropriate activation of control lines VC1 to VC3, any of additional nmos transistors n1 to n3 may be inserted into the pull-down branch and the value of Vrefsa adjusted accordingly. This permits iterative adjustment of Vrefsa even after production. In this manner, the value of Vrefsa may be adjusted over the life of the memory IC to compensate for the effects of aging on the memory array and reference cell. The value of VC1 to VC3 may be stored within a predefined area of the main memory array.

Figure 10:
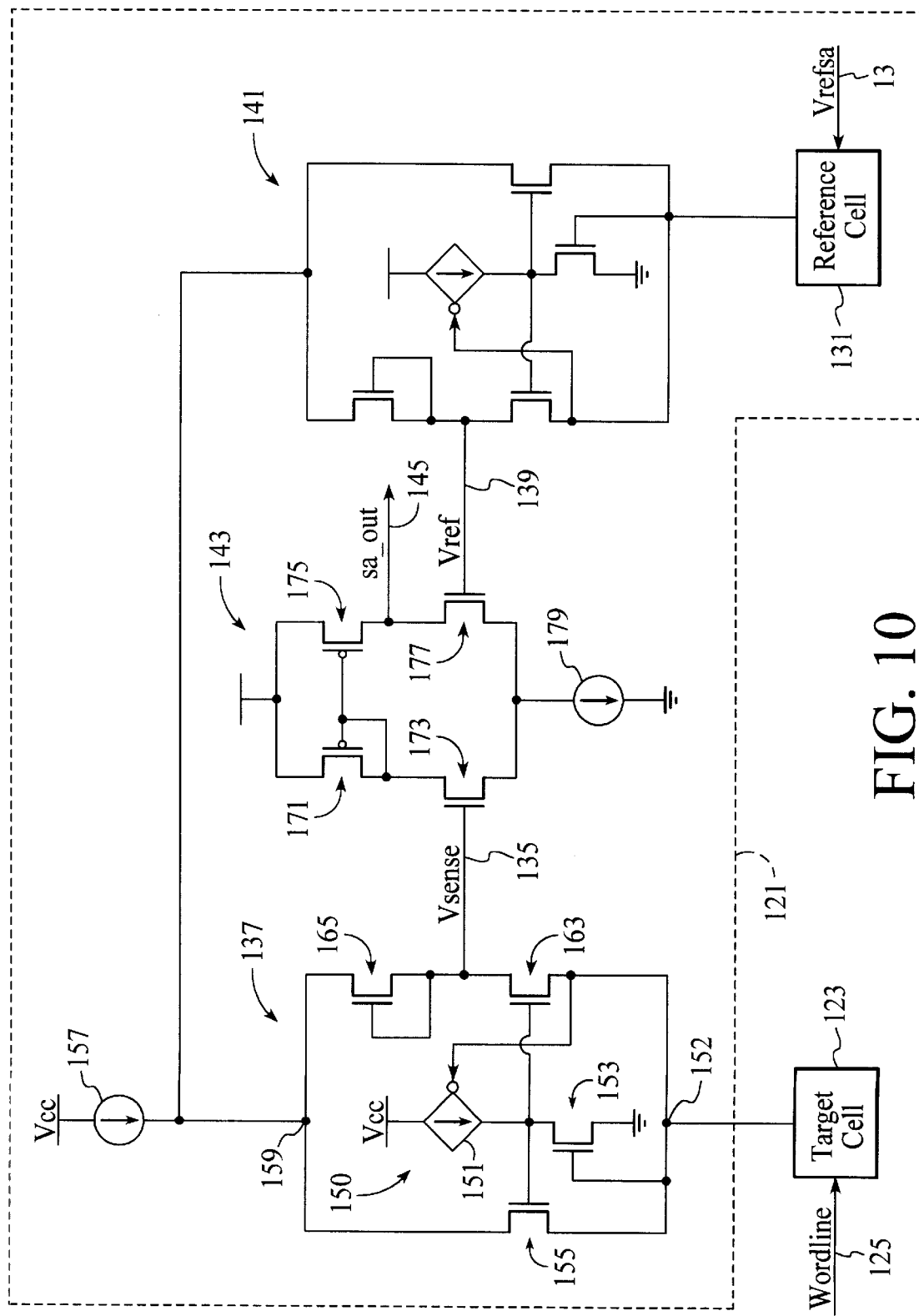
FIG. 10 is a detailed view of a sense amplifier in accord with the present invention.

With reference to FIG. 10, a second embodiment of a sensing circuit 121 in accord with the present invention and suitable to replace sensing circuit 17 of FIG. 2 is shown. For the sake of brevity, only the new elements of interest are shown. Omitted from the figure are y-select circuitry, sense amplifier enable circuitry, output drivers, and other circuit elements already described above or considered to be within the scope of one versed in the art. In FIG. 10, a target memory cell 123, which is understood to be part of a main memory array, is applied to sensing circuit 121 for reading. As in the previous case of FIG. 2, target memory cell 123 is selected by the application of a read voltage at its corresponding wordline 125. The current sourcing magnitude of target memory cell 123 is compared with a reference current from reference cell 131, which ig responsive to a control potential Vrefsa. The configuration of target memory cell 123 and reference cell 131 may be any of the configurations discussed above with reference to FIGS. 2 to 9. Similarly, the magnitude of control potential line Vrefsa may be generated in a manner similar to that depicted with reference to FIG. 9.

In FIG. 10, the read current magnitude of target memory cell 123 is converted into a voltage representation on Vsense line 135 by means of a first transconductance amplifier 137. Similarly, the reference current from reference cell 131 is converted to a representative voltage value on Vref line 139 by second transconductance amplifier 141. The representative voltage potentials of Vsense line 135 and Vref line 139 are then compared by differential amplifier 143 and the result is placed on sense-amp output line sa_out, 145. It is to be understood that the sa_out output on line 145 would typically be amplified and latched.

First transconductance amplifier 137 is a composite of two regulated cascode amplifiers sharing a common regulating voltage amplifier 150. The common regulating voltage amplifier 150 consists of a variable current source 151 and a compensating transistor 153 coupled in series between Vcc and ground. Regulating amplifier 50 and transistors 165 and 163 constitute the first regulated cascode amplifier, and regulating amplifier 50 and transistor 155 constitute the second regulating cascode amplifier. The first and second regulating cascode amplifiers together form the first composite transconductance amplifier 137.

The current generated by target memory cell 125 flows through both first and second regulated cascode amplifiers, which together generate an amplified voltage representation of the current. Cascode circuits are used since they typically provide a high output impedance and a significantly lower feedback capacitance resulting in an amplifier having a larger dc gain. By using regulated cascodes, instead of simple unregulated cascodes, an even higher output impedance and a larger output voltage swing can be achieved. This permits higher amplification of a read current from a target memory cell 123 and reference current from a reference cell 131 making it easier for the differential amplifier 143 to differentiate between the two voltage potentials.

Additionally, in highly integrated memories, it is often necessary to use minimum size transistors, which can exhibit pronounce channel-length modulation and carrier multiplication, even at lower voltages. This is of special concern in nonvolatile memories, whose minimum size transistors are often in close proximity to high voltage transistors. Channel-length modulation will alter the behavior of a transistor and may upset the critical balance of a sense amplifier. It has been found that regulated cascode circuits, even with minimum size transistors, can achieve small circuit areas, good frequency response, high dc gains and mitigate the errors of channel modulation.

The first regulated cascode amplifier within first transconductance amplifier 137 includes first output nmos transistor 163, regulating voltage amplifier 150, constant current source 157, and memory cell 123 itself. It should be noted that contrary to typical cascode architectures, current source 151 of regulating voltage amplifier 150 is not a constant current source, rather it is controlled by the source electrode of nmos transistor 163 within the first regulated cascode. In essence, the first regulated cascode is a self-regulated cascode.

In operation, target memory transistor 123 converts the read voltage on wordline 125 into a drain current that partly flows through the drain-source path of first output nmos transistor 163 to Vsense line 135, which is applied to differential amplifier 143. Constant current source 157 supplies the drain of output nmos transistor 163 through nmos diode-connected transistor 165. To obtain a high output resistance, i.e. to suppress channel-length modulation of target memory cell 123, the respective drain-source voltage must be kept stable. This is accomplished by a feedback loop consisting of regulating voltage amplifier 150 (dependent current source 151 and transistor 153) and first output nmos transistor 163 as a voltage follower. Therefore, the drain-source voltage of target memory cell 123 is regulated to a fixed value.

To further stabilize the potential at the source of first output transistor 163, i.e. the drain of target memory cell 123, the source of transistor 163 is coupled to control variable current source 151. Preferably, the current magnitude of variable current source 151 is made inversely proportional to the potential at the source of first output transistor 163. This can be done, for example, by implementing variable current source 151 as a pmos transistor. In this manner, if the potential at the source of output transistor 163 falls, the current magnitude of variable current source 151 will increase causing the potential at the control gate of output transistor 163 to rise. This in turn will turn on harder transistor 163 causing it to raise back up the potential at its source. Similarly, if the potential at the source of output transistor 163 rises, the magnitude of variable current source 151 will be reduced lowering the potential at the control gate of output transistor 163 and causing it to source less current and bring back down the potential at its source.

Thus, the present self-regulated cascode amplifier uses two mechanisms to minimize voltage fluctuations at node 152. First it uses a feedback mechanism between regulating transistor 153 and output transistor 163, and secondly uses a feedback mechanism between variable current source 151 and output transistor 163. Although this helps stabilize the potential at the drain of first output transistor 163, the current through target memory cell 123 is still converted to a representative potential at the drain of output transistor 163 since the source-to-drain potential of first output transistor 163 is still allowed to vary.

The second regulated cascode functions in manner similar to that of the first regulated cascode discussed above. It includes a second output nmos transistor 155, regulating voltage amplifier 150, constant current source 157 and target memory cell 123 itself. In operation, target memory transistor 123 converts the read voltage on wordline 125 into a drain current that partly flows through the drain-source path of second output nmos transistor 155 to an intermediate output node 159. constant current source 157 supplies intermediate output node 159 and the voltage potential of intermediate output node 159 is established by the amount of current through nmos transistor 155. To obtain a high output resistance, i.e. to suppress channel-length modulation of target memory cell 123, the respective drain-source voltage is kept stable. This is accomplished by a feedback loop consisting of regulating voltage amplifier 150 and second output nmos transistor 155 as a voltage follower. Therefore, the drain-source voltage of target memory cell 123 is regulated to the same fixed value.

The output of transconductance amplifier 137 is taken at the drain of first output nmos transistor 163, which is coupled the drain of second output nmos transistor 155 through diode connected transistor 161. Thus, the potential of Vsense line 135 is under direct control of both first and second regulated cascode amplifiers with their respective outputs coupled together via a diode. This permits the potential of Vsense line 135 to more quickly reach a stable value and thereby improve the reading speed of sensing circuit 121.

The current of reference cell 131 is converted into a representative voltage potential at Vref line 139 by means of second composite transconductance amplifier 141. In order to better balance sensing circuit 121, second composite transconductance amplifier has the same structure as the first composite transconductance amplifier 137 and functions in a similar manner, as described above. Furthermore, both of said first 137 and second 141 composite transconductance amplifiers are supplied by the same constant current source 147.

The potentials of Vsense line 135 and Vref line 139 are applied to differential amplifier 143. Differential amplifier 143 includes a first branch consisting of pmos transistor 171 and nmos transistor 173 connected in series, and includes a second branch consisting of pmos transistor 175 and nmos transistor 177 connected in series. The first and second branches are connected in parallel between Vcc and a current drain 179. The drain of pmos transistor 171 is connected to the control gates of pmos transistors 171 and 175. vsense line 135 is coupled to the control gate of nmos transistor 173 and Vref line 139 is coupled to the control gate of nmos transistor 177. The drain of pmos transistor 177 is the output, sa_out, on line 145 of differential amplifier 143.

What is claimed is:

1. A reference voltage generator for use with a sense amplifier comprising:

a reference voltage output node coupled to said sense amplifier;

a voltage input node for receiving a controlled voltage potential; and a first MOS reference cell having a first drain region, a first source region, a first control gate, a first polysilicon gate, a first channel region, a first tunneling oxide, and a first gate oxide, said first drain region and said first source region being on opposing sides of said first channel region, said first polysilicon gate being separated from said first channel region by said first tunneling oxide, said first gate oxide being interposed between said first control gate and said first polysilicon gate, said first drain region being coupled to said reference voltage output node, said first source region being coupled to a first reference power rail, said voltage input node being coupled to both said first control gate and to said first polysilicon gate, said controlled voltage potential being effective for actuating said first MOS reference cell; and a via connecting said first control gate to said first polysilicon gate.

2. The reference voltage generator of claim 1 further having a first select switch selectively isolating said first drain region from said reference voltage output node and selectively coupling said first drain region to said reference voltage output node.

3. The reference voltage generator of claim 2 wherein said first select switch is an MOS transistor.

4. The reference voltage generator of claim 2 wherein said sense amplifier is coupled to a target data memory cell during each read operation, said target data memory cell being part of a memory array of rows and columns of data memory cells, said sense amplifier being effective for comparing a first current measure from said target data memory cell with a second current measure from said reference voltage output node and providing a first output logic state in response to said first current measure being greater than said second current measure and providing a second output logic state in response to said first current measure being less than second current measure;

said first select switch further being effective for isolating said first MOS reference cell from said reference voltage output node in response to said target data memory cell being within an even numbered row of said memory array, and effective for coupling said first reference cell to said reference voltage output node in response to said target data memory cell being within an odd numbered row of said memory array.

5. The reference voltage generator of claim 4 wherein said reference voltage generator further includes a second MOS reference cell having a second drain region, a second source region, a second control gate, a second polysilicon gate, a second channel region, a second tunneling oxide, and a second gate oxide, said second drain region and said second source region being on opposing sides of said second channel region, said second polysilicon gate being separated from said second channel region by said second tunneling oxide, said second gate oxide being interposed between said second control gate and said second polysilicon gate, said second drain region being selectively coupled to said reference voltage output node, said second source region being coupled to said reference power rail, said voltage input node being connected to both said second control gate and to said second polysilicon gate, said controlled voltage potential being effective for actuating said second MOS reference cell, and said second MOS reference cell being coupled to said output node when said first select transistor is isolating said first MOS reference cell from said output node.

6. The reference voltage generator of claim 5 wherein said first and second channel regions are formed in a collinear fashion on a single substrate.

7. The reference voltage generator of claim 5 further including a second select switch, an inverter, and a cell select control input line;

said second select switch being coupled between said second drain region and said reference voltage output node;

said inverter having an inverter input and an inverter output, said cell select control line being coupled to said inverter input and to a control input of said first switch, said inverter output being coupled to a control input of said second switch, said select control input line being effective for closing only one of said first and second switches at a time.

8. The reference voltage generator of claim 7 wherein said first and second select switches are MOS transistors and said select control input line is directly coupled to the control gate of said first select switch, said inverter output being coupled to the control gate of said second select switch.

9. The reference voltage generator of claim 4 further having row detecting circuit for determining when said target data memory cell lies within an odd numbered row within said memory array and for determining when said target memory cell lies within an even numbered row within said memory array, said first select switch being responsive to said row detecting circuit.

10. The reference voltage generator of claim 9 wherein said row detecting circuit is an x-decoder coupled to select a row of data memory cells within said memory array.

11. The reference voltage generator of claim 9 wherein said row detecting circuit is the least significant bit of an x-address bus effective for selecting a row within said memory array such that said reference voltage generator is under direct control of said x-address bus.

12. The reference voltage generator of claim 9 further having a first row decoder and a second row decoder, said first row decoder being an x-decoder for receiving a row address bus and selecting a corresponding single row within said memory array, said second row decoder being a partial decoder for observing a row address line within said row address bus, said row address line being effective for determining when said corresponding single row is an even numbered row and when it is an odd numbered row within said memory array, said row detecting circuit being said second row decoder.

13. The reference voltage generator of claim 1 wherein said voltage input node is coupled to receive said controlled voltage potential from a voltage control circuit comprising at least one pull-up path and a pull-down path;

said pull-up path including a constantly ON pull-up device coupling said voltage input node to a second reference power rail;

said pull-down path including at least a first and second pull-down circuit in parallel, said first pull-downcircuit having a constantly 0 pull-down device coupling said voltage input node to said first reference power rail, said second pull-down circuit including at least one resistive element and at least one switch in series between said control input node and said first reference power rail, said switch selectively coupling said resistive element to said first reference power rail in response to a first switch control line.

14. The reference voltage generator of claim 13 wherein said second pull-down circuit includes a plurality of resistive element and switch pairs, each resistive element and switch within each of said pairs being connected in series between said voltage input node and said first reference power rail, each switch within each of said pairs being controlled by a respective switch control line for selectively inserting and removing said pairs from said second pull-down path.

15. The reference voltage generator of claim 13 wherein said respective switch control lines are under direct control of a user for manually setting the voltage potential of said voltage input node.

16. The reference voltage generator of claim 13 wherein the logic state of said first switch control line is stored in a nonvolatile memory cell.

17. The reference voltage generator of claim 16 wherein said nonvolatile memory cell is part of said memory array.

18. The reference voltage generator of claim 1 wherein said sense amplifier includes a transconductance amplifier circuit and a differential amplifier, said transconductance amplifier circuit including a first intermediate node, a second intermediate node, an amplified output node, a first nmos transistor, a second nmos transistor, a third nmos transistor, a diode, a variable current source, and a constant current source;

said first intermediate node coupled to said reference output node, said constant current source coupled between a reference high power rail and said second intermediate node, the drain of said first nmos transistor coupled to said second intermediate node and the source of said first nmos transistor being coupled to said first intermediate node, said variable current source being coupled between said reference high power rail and the control gate of said first nmos transistor, said second nmos transistor having a drain coupled to the control gate of said first nmos transistor and having a source coupled to reference ground and having a control gate coupled to said first intermediate node, said diode being coupled between second intermediate node and said amplified output node, said third nmos transistor having a drain coupled to said amplified output node and having a source coupled to said first intermediate node and having a control gate coupled to the control gate of said first nmos transistor, the source of said third nmos transistor being coupled to control the current magnitude of said variable current source, said amplified output node being coupled to an input of said differential amplifier.

19. The reference voltage generator of claim 18 wherein said variable current source is a pmos transistor.

20. The reference voltage generator of claim 18 wherein said diode is a diode-connected nmos transistor.

21. A reference voltage generator for use with a sense amplifier comprising:

a reference voltage output node coupled to said sense amplifier;

a control input node for receiving a controlled voltage potential;

a first reference cell having a first select switch and a first reference transistor in series between said reference voltage output node and a first reference power rail;

a second reference cell having a second select switch and a second reference transistor in series between said reference voltage output node and said first reference power rail;

each of said first and second reference transistors including a respective drain region, source region, control gate, first polysilicon gate, channel region, tunneling oxide, and inter-gate oxide; said first and second reference transistors having their respective control gate coupled to their respective polysilicon gate by means of a respective via;

said controlled voltage potential being effective for actuating said first and second reference transistors;

said sense amplifier further being coupled to a target data memory cell during every read operation, said target data memory cell being part of a main memory array of rows and columns of data memory cells, said sense amplifier being effective for comparing a first current measure from said target data memory cell with a second current measure from said reference voltage output node and providing a first output logic state in response to said first current measure being greater than said second current measure and providing a second output logic state in response to said first current measure being less than said second current measure;

said first switch being effective for isolating said first reference cell from said reference voltage output node in response to said target data memory cell being within an even numbered row of said main memory array, and said second switch being effective for isolating said second reference cell from said voltage output node in response to said target data memory cell being within an odd numbered row of said main memory array, at least one of said first and second reference cells being coupled to said voltage output node during each read operation.

22. The reference voltage generator of claim 21 wherein both of said first and second reference transistors have their respective first polysilicon gate separated from their respective channel region by their respective tunneling oxide, their respective control gate being over their respective first polysilicon gate with their respective inter-gate oxide being interposed therebetween, their respective drain region being coupled to their respective select switch, their respective source region being coupled to said first reference power rail, said control input node being coupled to the respective control gate and first polysilicon gate of both of said first and second reference transistors.

23. The reference voltage generator of claim 22 wherein the respective channel regions of said first and second reference transistors are formed in a collinear fashion on a single substrate.

24. The reference voltage generator of claim 21 wherein said first and second select switches are NMOS transistors.

25. The reference voltage generator of claim 21 further having a row detector circuit for determining when said target data memory cell lies within an odd numbered row within said main memory array and for determining when said target memory cell lies within an even numbered row within said main memory array, said first and second switch being responsive to said row detector circuit.

26. The reference voltage generator of claim 21 further including an inverter and a cell select line, said cell select line being coupled directly to said second select switch and coupled via said inverter to said first select switch, said cell select line being effective for closing said first select switch and opening said second select switch when said cell select line is at a first logic state, said cell select line further being effective for opening said first select switch and closing said second select switch when said cell select line is at a second logic state, said row detector circuit being coupled to control said cell select line and effective for placing said first logic state on said cell select line in response to said target memory cell being within an odd numbered row of said main memory array and for placing said second logic state on said cell select line in response to said target memory cell being within an even numbered row of said main memory array.

27. The reference voltage generator of claim 26 wherein said row detector circuit is an x-decoder coupled to select a row of data memory cells within said main memory array.

28. The reference voltage generator of claim 26 wherein said row detector circuit is the least significant bit of an x-address bus effective for selecting a row within said memory array such that said reference voltage generator is under direct control of said x-address bus.

29. The reference voltage generator of claim 26 further having a first row decoder and a second row decoder, said first row decoder being an x-decoder for receiving a row address and selecting a corresponding single row within said memory array, said second row decoder being a partial decoder for observing a single bit within said row address, said single bit being effective for determining when said corresponding single row is an even numbered row and when it is an odd numbered row within said memory array, said row detector circuit being said second row recorder.

30. The reference voltage generator of claim 21 wherein said control input noae is coupled to receive raid controlled voltage potential from a voltage control circuit comprising at least one pull-up path and a pull-down path;

said pull-up path including a pull-up device continuously conducting current and coupling said control input node to a reference high power rail;

said pull-down path including at least a first and second pull-down circuit in parallel, said first pull-down circuit continuously sourcing current and coupling said voltage input node to reference ground, said second pull-down circuit including at least one resistive element and at least one switch in series between said control input node and reference ground, said switch selectively coupling said resistive element to reference ground in response to a first switch-control line.

31. The reference voltage generator of claim 30 wherein said second pull-down circuit includes a plurality of resistive element and switch pairs, each resistive element and switch within each of said pairs being connected in series between said control input node and reference ground, each switch within each of said pairs being controlled by a respective switch-control line for selectively inserting and removing said pairs from said second pull-down path.

32. The reference voltage generator of claim 31 wherein said switch-control lines are under direct control of a user for manually setting the voltage potential of said voltage input node.

33. The reference voltage generator of claim 31 wherein the logic state of each of said respective switch control lines is stored in a respective nonvolatile memory cell.

34. The reference voltage generator of claim 33 wherein said respective nonvolatile memory cells are part Of said memory array.

35. The reference voltage generator of claim 21 wherein said sense amplifier includes a transconductance amplifier circuit and a differential amplifier, said transconductance amplifier including a first intermediate node, a second intermediate node, an amplified output node, a first nmos transistor, a second nmos transistor, a third nmos transistor, a diode, a variable current source, and a constant current source;

said first intermediate node coupled to said reference output node, said constant current source coupled between a reference high power rail and said second intermediate node, the drain of said first nmos transistor coupled to said second intermediate node and the source of said first nmos transistor being coupled to said first intermediate node, said variable current source being coupled between said reference high power rail and the control gate of said first nmos transistor, said second nmos transistor having a drain coupled to the control gate of said first nmos transistor and having a source coupled to reference ground and having a control gate coupled to said first intermediate node, said diode being coupled between said second intermediate node and said amplified output node, said third nmos transistor having a drain coupled to said amplified output node and having a source coupled to said first intermediate node and having a control gate coupled to the control gate of said first nmos transistor, the source of said third nmos transistor being coupled to control the current magnitude of said variable current source, said amplified output node being coupled to an input of said differential amplifier.

36. The reference voltage generator of claim 35 wherein said variable current source is a pmos transistor.

37. The reference voltage generator of claim 35 wherein said diode is a diode connected nmos transistor.

38. A reference voltage generator for use with a sense amplifier comprising:

a reference voltage output node coupled to said sense amplifier;

a voltage input node for receiving a controlled voltage potential; and a first reference cell circuit block having a first MOS reference cell, said first MOS reference cell having a first drain region, a first source region, a first control gate, a first lower polysilicon gate, a first channel region, a first tunneling oxide, and a first gate oxide, said first drain region and said first source region being on opposing sides of said first channel region, said first lower polysilicon gate being over and separated from said first channel region by said first tunneling oxide, said first control gate being over said first lower polysilicon gate with said first gate oxide being interposed therebetween, said first drain region being selectively coupled to said reference voltage output node, said first source region being coupled to a first reference power rail, said voltage input node being continuously coupled to both said first control gate and to said first polysilicon gate, said controlled voltage potential being effective for actuating said first MOS reference cell;

a second reference cell circuit block having a second reference MOS cell, said second MOS reference cell having a second drain region, a second source region, a second control gate, a second lower polygilicon gate, a second channel region, a second tunneling oxide, and a second gate oxide, said second drain region and said second source region being on opposing sides of said second channel region, said second lower polysilicon gate being over and separated from said second channel region by said second tunneling oxide, said second control gate being over said second lower polysilicon gate with said second gate oxide being interposed therebetween, said second drain region being selectively coupled to said reference voltage output node, said second source region being coupled to said reference power rail, said voltage input node being connected to both said second control gate and to said second lower polygilicon gate, said controlled voltage potential being effective for actuating said second MOS reference cell;

said sense amplifier being coupled to a target data memory cell during each read operation, said target data memory cell being part of a memory array of rows and columns of data memory cells, said sense amplifier being effective for comparing a first current measure from said target data memory cell with a second current measure from said reference voltage output node and providing a first output logic state in response to said first current measure being greater than said second current measure and providing a second output logic state in response to said first current measure being less than second current measure;

row detector circuit for determining when said target data memory cell lies within an odd numbered row within said memory array and for determining when said target memory cell lies within an even numbered row within said memory array, said first MOS reference cell being isolated from said reference voltage output node and said second MOS reference cell being coupled to said reference voltage output node in response to said target data memory cell being within an even numbered row of said memory array, said first MOS reference cell being coupled to said reference voltage output node and said second MOS reference cell being isolated from said reference voltage output node in response to said target data memory cell being within an even numbered row of said memory array; and a first via connecting said first control gate to said first lower polysilicon gate and a second via connecting said second control gate to said second lower polysilicon gate.

39. The reference voltage generator of claim 38 wherein said first and second channel regions are formed in a collinear fashion on a single substrate.

40. The reference voltage generator of claim 39 further having a first and second select switches responsive to said row detector circuit, said first select switch being coupled between said first drain region and said reference voltage output node and being effective for selectively isolating said first drain region from said reference voltage output node and for selectively coupling said first drain region to said reference voltage output node, said second select switch being coupled between said second drain region and said reference voltage output node and being effective for selectively isolating said second drain region from said reference voltage output node and for selectively coupling said second drain region to said reference voltage output node.

41. The reference voltage generator of claim 40 wherein said first and second select switches are MOS transistors.

42. The reference voltage generator of claim 41 further having an inverter and a cell select control input line, said inverter having an inverter input and an inverter output, said cell select control line being coupled to said inverter input and to the control gate of said first select switch, said inverter output being coupled to the control gate of said second switch, said cell select line being effective for closing said first select switch and opening said second select switch when said cell select line is at a first logic state, said cell select line further being effective for opening said first select switch and closing said second select switch when said cell select line is at a second logic state, said row detector circuit being coupled to control said cell select line and effecting for placing said first logic state on said cell select line in response to said target memory cell being within an odd numbered row of said main memory array and for placing said second logic state on said cell select line in response to said target memory cell being within an even numbered row of said main memory array.

43. The reference voltage generator of claim 42 wherein said row detector circuit is an x-decoder coupled to select a row of data memory cells within said main memory array.

44. The reference voltage generator of claim 42 wherein said row detector circuit is the least significant bit of an x-address bus effective for selecting a row within said main memory array such that said reference voltage generator is under direct control of said x-address bus.

45. The reference voltage generator of claim 42 further having a first row decoder and a second row decoder, said first row decoder being an x-decoder for receiving a row address and selecting a corresponding single row within said memory array, said second row decoder being a partial decoder for observing a single bit within said row address, said single bit being effective for determining when said corresponding single row is an even numbered row and when it is an odd numbered row within said memory array, said row detector circuit being said second row decoder.

46. The reference voltage generator of claim 40 wherein said voltage input node is coupled to receive said controlled voltage potential from a voltage control circuit comprising at least one pull-up path and a pull-down path;

said pull-up path including a constantly ON pull-up device coupling said voltage input node to a second reference power rail;

said pull-down path including at least a first and second pull-down circuit in parallel, said first pull-down circuit having a constantly ON pull-down device coupling said voltage input node to said first reference power rail, said second pull-down circuit including at least one resistive element and at least one switch in series between said control input node and said first reference power rail, said switch selectively coupling said resistive element to said first reference power rail in response to a first switch control line.

47. The reference Voltage generator of claim 46 wherein the logic state of said first switch control line is stored in a nonvolatile memory cell.

48. The reference voltage generator of claim 47 wherein said nonvolatile memory cell is part of said main memory array.

49. The reference voltage generator of claim 46 wherein said second pull-down circuit includes a plurality of resistive element and switch pairs, each resistive element and switch within each of said pairs being connected in series between said voltage input node and said first reference power rail, each switch within each of said pairs being controlled by a respective switch control line for selectively inserting and removing said pairs from said second pull-down circuit.

50. The reference voltage generator of claim 49 wherein said respective switch control lines are under direct control of a user for manually setting the voltage potential of said voltage input node.

51. The reference voltage generator of claim 38 wherein said sense amplifier includes a transconductance amplifier circuit and a differential amplifier, said transconauctance amplifier including a first intermediate node, a second intermediate node, an amplified output node, a first nmos transistor, a second nmos transistor, a third nmos transistor, a diode, a variable current source, and a constant current source;

said first intermediate node coupled to said reference output node, said constant current source coupled between a reference high power rail and said second intermediate node, the drain of said first nmos transistor coupled to said second intermediate node and the source of said first nmos transistor being coupled to said first intermediate node, said variable current source being coupled between said reference high power rail and the control gate of said first nmos transistor, said second nmos transistor having a drain coupled to the control gate of said first nmos transistor and having a source coupled to reference ground and having a control gate coupled to said first intermediate node, said diode being coupled between said second intermediate node and said amplified output node, said third nmos transistor having a drain coupled to said amplified output node and having a source coupled to said first intermediate node and having a control gate coupled to the control gate of said first nmos transistor, the source of said third nmos transistor being coupled to control the current magnitude of said variable current source, said amplified output node being coupled to an input of said differential amplifier.

52. The reference voltage generator of claim 51 wherein said variable current source is a pros transistor.

53. The reference voltage generator of claim 51 wherein said diode is a diode connected nmos transistor.

* * * * *

UNITED STATES PATENT AND TRADEMARK OFFICE
CERTIFICATE OF CORRECTION

PATENT NO. : 6,411,549 B1
DATED : June 25, 2002
INVENTOR(S) : Saroj Pathak et al.

It is certified that error appears in the above-identified patent and that said Letters Patent is hereby corrected as shown below:

Column 2,
Line 16, "memory cell 22 hag a similar structure" should read -- memory cell 22 has a similar structure --.
Lines 38 and 39, "cell 22 should not changed" should read -- cell 22 should not change --.
Lines 63-64, "an intrinsic electric charge associate with it" should read -- an intrinsic electric charge associated with it --.

Column 3,
Lines 13 and 14, "continues to increase and their speeds requirements continue to rise" should read -- continues to increase and their speed requirements continue to rise --.

Column 4,
Line 5, "Even if the charge in a the reference cell can be initiated" should read -- Even if the charge in the reference cell can be initiated --.
Line 30, "to eliminates any errors resulting from charge" should read -- to eliminate any errors resulting from charge --.

Column 6,
Line 21, "noae 19, which is an input" should read -- node 19, which is an input --.
Lines 38 and 39, "which raises it threshold voltage above the read voltage" should read -- which raises its threshold voltage above the read voltage --.
Line 47, "node 19 is additional coupled to VCC via a" should read -- node 19 is additionally coupled to VCC via a --.

Column 7,
Line 58, "overall tsense time required for sene amplifier 23" should read -- overall $t_{sense}$ time required for sense amplifier 23 --.

Column 8,
Lines 24 and 25, "the dimensions of the second part 53 are is preferably the same" should read -- the dimensions of the second part 53 are preferably the same --.
Lines 54 and 55, "absolute control over the coupling ration" should read -- absolute control over the coupling ratio --.
Line 57, "has a 100% coupling ration" should read -- has a 100% coupling ratio --.

UNITED STATES PATENT AND TRADEMARK OFFICE
CERTIFICATE OF CORRECTION

PATENT NO.    : 6,411,549 B1
DATED         : June 25, 2002
INVENTOR(S)   : Saroj Pathak et al.

It is certified that error appears in the above-identified patent and that said Letters Patent is hereby corrected as shown below:

Column 12,
Line 24, "which ig responsive to" should read -- which is response to --.

Column 16,
Line 45, "having a constantly O pull-down device" should read -- having a constantly ON pull-down device --.

Column 19,
Line 8, "second row recorder" should read -- second row decoder --.
Lines 10 and 11, "said control input noae is coupled to receive raid controlled voltage potential" should read -- said control input node is coupled to receive said controlled voltage potential --.

Column 20,
Line 39, "lower polygilicon gate" should read -- lower polysilicon gate --.

Column 22,
Line 46, "said transconauctance amplifier including" should read -- said transconductance amplifier including --.

Signed and Sealed this

Twenty-fifth Day of March, 2003

JAMES E. ROGAN
*Director of the United States Patent and Trademark Office*